(12) United States Patent
Pelley et al.

(10) Patent No.: US 9,480,161 B2
(45) Date of Patent: Oct. 25, 2016

(54) THIN LOW PROFILE STRIP DUAL IN-LINE MEMORY MODULE

(71) Applicant: Freescale Semiconductor, Inc., Austin, TX (US)

(72) Inventors: Perry H. Pelley, Austin, TX (US); Michael B. McShane, Austin, TX (US); Tim V. Pham, Austin, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 127 days.

(21) Appl. No.: 14/158,310

(22) Filed: Jan. 17, 2014

(65) Prior Publication Data

US 2015/0208510 A1   Jul. 23, 2015

(51) Int. Cl.
| | |
|---|---|
| H05K 1/18 | (2006.01) |
| H05K 1/11 | (2006.01) |
| H01L 23/538 | (2006.01) |
| H01L 25/10 | (2006.01) |
| H01L 25/065 | (2006.01) |
| H05K 3/34 | (2006.01) |
| G11C 5/06 | (2006.01) |

(52) U.S. Cl.
CPC ............ *H05K 1/181* (2013.01); *H01L 23/5384* (2013.01); *H01L 25/0652* (2013.01); *H01L 25/10* (2013.01); *G11C 5/063* (2013.01); *H01L 23/5385* (2013.01); *H01L 2224/131* (2013.01); *H01L 2224/13147* (2013.01); *H01L 2224/16145* (2013.01); *H01L 2224/16225* (2013.01); *H01L 2225/06513* (2013.01); *H01L 2225/06517* (2013.01); *H01L 2225/06562* (2013.01); *H01L 2924/1434* (2013.01); *H05K 3/3415* (2013.01); *H05K 2201/097* (2013.01); *H05K 2201/10159* (2013.01); *H05K 2201/10378* (2013.01); *H05K 2201/10545* (2013.01); *Y02P 70/611* (2015.11)

(58) Field of Classification Search
CPC .................................. H05K 1/18; H05K 1/11
USPC ............... 257/686, 678, 679, 680, 690, 723
See application file for complete search history.

(56) References Cited

U.S. PATENT DOCUMENTS

| | | | | |
|---|---|---|---|---|
| 5,434,745 A | * | 7/1995 | Shokrgozar et al. | 361/735 |
| 5,998,860 A | * | 12/1999 | Chan et al. | 257/679 |
| 6,259,622 B1 | * | 7/2001 | Fried et al. | 365/94 |
| 6,337,227 B1 | | 1/2002 | Ball | |
| 6,427,156 B1 | * | 7/2002 | Chapman et al. | 708/235 |
| 6,603,072 B1 | | 8/2003 | Foster et al. | |
| 7,061,092 B2 | * | 6/2006 | Akram et al. | 257/690 |
| 7,198,979 B2 | * | 4/2007 | Thomas et al. | 438/107 |
| 7,514,776 B2 | | 4/2009 | Vaiyapuri | |
| 7,560,304 B2 | * | 7/2009 | Takiar et al. | 438/107 |
| 7,939,920 B2 | | 5/2011 | Wallace | |
| 8,436,460 B1 | | 5/2013 | Gamboa et al. | |

(Continued)

*Primary Examiner* — Sheng Zhu

(57) ABSTRACT

A low profile strip dual in-line memory module (200) includes a passive interposer support structure (90) with patterned openings (91-97) formed between opposing top and bottom surfaces, a plurality of memory chips (D1-D8) attached to the top and bottom surfaces, and vertical solder ball conductors (98) extending through the patterned openings to electrically connect the plurality of memory chips, where each memory chip has an attachment surface facing the passive interposer structure and a patterned array of horizontal conductors (e.g., 82-86) formed on the attachment surface with contact pads electrically connected to the plurality of vertical conductors to define at least one bus conductor that is electrically connected to each memory die in the first and second plurality of memory die.

20 Claims, 8 Drawing Sheets

(56) References Cited

U.S. PATENT DOCUMENTS

| | | |
|---|---|---|
| 2002/0157082 A1 | 10/2002 | Shau |
| 2005/0156333 A1* | 7/2005 | Chiou et al. ............... 257/787 |
| 2007/0145558 A1 | 6/2007 | Chia et al. |
| 2009/0194855 A1 | 8/2009 | Liu et al. |
| 2010/0062621 A1 | 3/2010 | Bruennert et al. |
| 2010/0109134 A1 | 5/2010 | Jereza |

* cited by examiner

THIN LOW PROFILE STRIP DUAL IN-LINE MEMORY MODULE

BACKGROUND OF THE INVENTION

1. Field of the Invention

The present invention is directed in general to field of integrated circuit memory devices. In one aspect, the present invention relates to a memory apparatus and method of operation.

2. Description of the Related Art

Computer systems increasingly use memory devices, such as dual-inline memory modules (DIMMs), to provide random access memory, not only for mounting RAM memory modules on a printed circuit board for plugging into computer motherboard, but also as a replacement for solid state drives (SSD) to store data on chips instead of on magnetic or optical discs. In a typical DIMM, a number of individual RAM chips—typically dynamic RAM (DRAM) chips—are mounted on a printed circuit board. However, there continue to be operational challenges and costs associated with reducing the size of such memory configurations while increasing the data storage density. As the complexity and density of DIMM integrated circuits increases while the form factor shrinks, the challenges required for routing signals to each memory chip on the DIMM increases. For example, the provision of separate chip enable signals to each DIMM memory chip can add significant costs in terms of additional signaling lines, signal routing problems, and increased die size and operational complexity. As a result, the existing solutions for providing a compact, low cost, high density DIMM which uses minimal board space is extremely difficult at a practical level.

BRIEF DESCRIPTION OF THE DRAWINGS

The present invention may be understood, and its numerous objects, features and advantages obtained, when the following detailed description of a preferred embodiment is considered in conjunction with the following drawings, in which.

DETAILED DESCRIPTION

Figure 1:
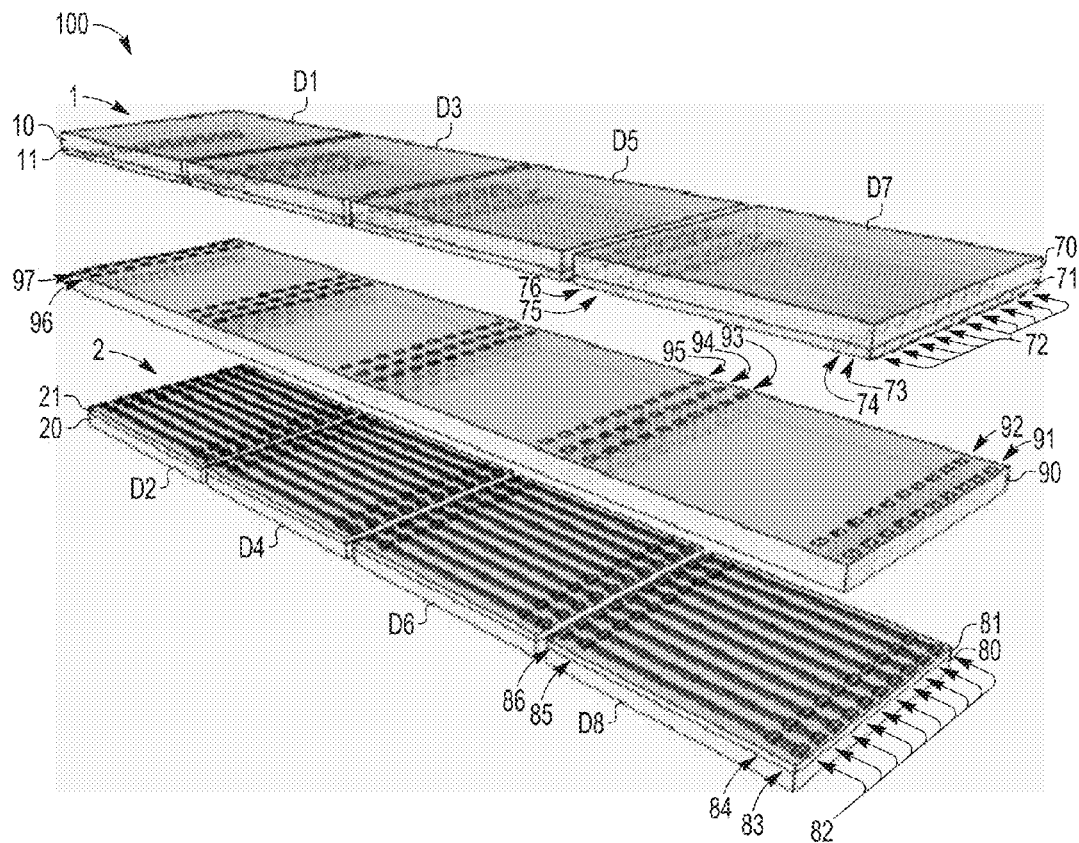
FIG. 1 illustrates an exploded perspective view of dual in-line memory module strips disposed around a passive interposer support structure in accordance with selected embodiments of the present disclosure.

A method, apparatus, system and programming operation are disclosed for fabricating and/or operating a memory device, such as a thin low profile strip dual in-line memory module (DIMM). In selected embodiments, the strip DIMM includes a plurality of memory die formed in offset positions on opposite sides of a passive interposer structure. On each memory die, one or more conductive redistribution lines are formed at an interconnect surface to connect contact pads to one or more redistribution pads arrayed on opposite ends of the die. In addition, the memory die on the strip DIMM are connected together through a pattern of solder ball conductors formed in patterned openings through the passive interposer structure. By aligning the conductive redistribution lines, contact pads, and patterned openings in the passive interposer structure with the pattern of solder ball conductors, one or more bus signals may be routed to each memory die in the strip DIMM without requiring the formation of any horizontal conductors on either surface of the passive interposer structure. In other embodiments, each memory die my be separately addressed or enabled by including programming regions on each die, where each die's programming region includes an array of program contact pads and connector lines which are used to route a first signal contact pad to one of a pair of redistribution contact pads. By positioning the programming regions on a first or bottom die to be aligned with corresponding programming regions on a second or top die that is disposed in offset alignment across the passive interposer structure, connections between die through the passive interposer structure may be formed by programming solder ball connections to selectively connect the array of program contact pads in aligned programming regions. In this way, a plurality of n select lines may be used to individually select die on the strip DIMM from a plurality of 2n die without requiring 2n separate selection lines to each die. When implemented with NAND flash memory, the strip DIMM may be used to provide solid state memory with higher capacity density, lower power consumption, lower cost, and smaller profile with improved read and write speeds. In an example flash memory scheme, the strip DIMM is constructed with eight identical flash memory die connected to a passive interposer structure, with a bottom group of four die connected to the bottom of the passive interposer structure and a top group of four flipped die connected to the top of the passive interposer structure. In selected embodiments, each group of die may be formed with singulated die or with unsingulated dice (e.g., a 1×N configuration) to reduce the required number of singulation saw cuts. Each memory die includes a conductive array of parallel redistribution lines and contact pads formed on an interconnect surface of the die. In addition, each group of die is arrayed linearly and offset from one another so that each die connected to the bottom of the passive interposer structure overlaps with a die connected to the top of the passive interposer structure. With this overlapping arrangement, the memory die are interconnected across the conductive arrays and vertical conductors formed in a passive interposer structure. For example, electrical connections between die and through the passive interposer structure may be formed by programming solder ball connections in a template of patterned openings formed in the passive interposer structure. Solder ball programming in the template openings may also be used to connect programming regions on each die, thereby allowing individual die to be programmed based on respective positioning in the template with out requiring a separate chip select conductor line to each die.

In this disclosure, an improved dual in-line memory module design and method of operation are described for addressing various problems in the art where various limitations and disadvantages of conventional solutions and technologies will become apparent to one of skill in the art after reviewing the remainder of the present application with reference to the drawings and detailed description provided herein. Various illustrative embodiments of the present invention will now be described in detail with reference to the accompanying figures. While various details are set forth in the following description, it will be appreciated that selected embodiments of present invention may be practiced without these specific details, and that numerous implementation-specific decisions may be made to the invention described herein to achieve the circuit designer's specific goals, such as compliance with process technology or design-related constraints, which will vary from one implementation to another. While such a development effort might be complex and time-consuming it would nevertheless be a routine undertaking for those of ordinary skill in the art having the benefit of this disclosure. For example, selected aspects are depicted with reference to simplified cross sectional drawings of a semiconductor device without including every device feature or geometry in order to avoid limiting or obscuring the present invention. In addition, selected aspects are shown in block diagram form, rather than in detail, in order to avoid limiting or obscuring the present invention. It is also noted that, throughout this detailed description, certain materials will be formed and removed to fabricate the passive interposer structure, individual memory die, and conductive redistribution lines and contact pads in the strip DIMM. Where the specific procedures for forming or removing such materials are not detailed below, conventional techniques to one skilled in the art for growing, depositing, removing or otherwise forming such layers at appropriate thicknesses shall be intended. Such descriptions and representations are used by those skilled in the art to describe and convey the substance of their work to others skilled in the art, and the omitted details are well known and not considered necessary to teach one skilled in the art of how to make or use the present invention.

Turning now to FIG. 1, there is illustrated an exploded perspective view 100 of memory module strips 1, 2 disposed above and below a passive interposer support structure 90 in accordance with selected embodiments of the present disclosure. The bottom DIMM strip 2 includes a plurality of die D2, D4 D6, D8 arranged in a linear fashion each die having a one or more interconnect layers formed over a substrate with an array of conductive redistribution lines formed on the top interconnect surface to connect contact pads arrayed on opposite ends of the die. For example, die D8 includes a substrate 80, one or more interconnect layers 81 formed on the substrate 80, and an array of parallel conductors 82 running in a first direction to extend from first and second contact pads 83, 84 on one end of the die D8 to one or more additional contact pads 85, 86 formed on the opposite end of the die D8. In similar fashion, the other die D2, D4, D6 in the bottom strip 2 are formed as identical die having an identical array of parallel conductors and contact pads formed in alignment on the top interconnect surface each die. For example, die D2 includes a substrate 20, interconnect layer(s) 21, and an array of parallel conductors extending between contact pads formed on opposite ends of the die D2. Additional structural details of the bottom DIMM strip 2 are enumerated hereinbelow.

The top DIMM strip 1 is identical to the bottom DIMM strip 2 but is flipped upside down so that the interconnect layer(s) on the top and bottom die face one another. As a result, the array of parallel conductors and contact pads are formed on the bottom surface of the top DIMM strip 1, as indicated with dashed back edge lines. In particular, the top DIMM strip 1 includes a plurality of die D1, D3, D5, D7 arranged in a linear fashion, each die having a one or more interconnect layers formed on a substrate with an array of conductive redistribution lines formed on the bottom interconnect surface to connect contact pads arrayed on opposite ends of the die. Thus, die D7 includes a substrate 70, one or more interconnect layers 71 formed on the substrate 70, and an array of parallel conductors 72 running in a first direction to extend from first and second contact pads 73, 74 on one end of the die D7 to one or more additional contact pads 75, 76 formed on the opposite end of the die D7. In similar fashion, the other die D1, D3, D5 in the top strip 1 are formed as identical die having an identical array of parallel conductors and contact pads formed in alignment on the top interconnect surface each die. For example, die D1 includes a substrate 10, interconnect layer(s) 11, and an array of parallel conductors extending between contact pads formed on opposite ends of the die D1. Additional structural details of the top DIMM strip 1 are enumerated hereinbelow.

The passive interposer support structure 90 is shown as being disposed between the top and bottom DIMM module strips 1, 2, and may be formed with one or more passive layers, such as a dielectric, ceramic, or plastic material, that are not electrically conductive. In other embodiments, the passive interposer support structure 90 may be formed one or more thermally conductive layers that are not electrically conductive, such as an oxidized conductive material. For example, a thermally conductive passive interposer support structure 90 may be formed with oxidized aluminum, copper or other conductive material having one or more insulator layers formed on the outer surfaces. Depending on the material used, the passive interposer support structure 90 is formed to a sufficient thickness to provide mechanical support for the top and bottom DIMM module strips 1, 2 when mounted thereon. In the depicted interposer support structure 90, a patterned array of openings 91-97 is formed to extend through the passive interposer structure 90. At a minimum, the patterned array of parallel rows of openings 91-97 are aligned with contact pads in the top and bottom DIMM module strips to provide electrical connection therebetween upon formation of electrical conductor structures (e.g., solder balls) in selected openings 91-97. For example, the passive interposer support structure 90 includes first and second parallel rows of openings 91, 92 which are positioned and spaced for alignment with either or both of the contact pad rows 73, 74 on the top die D7, depending on the relative alignment of the top die D7 and interposer 90. By the same token, the parallel rows of openings 91, 92 are positioned and spaced for alignment with either or both of the contact pad rows 83, 84 on the bottom die D8, depending on the relative alignment of the bottom die D8 and interposer 90. The patterned array of parallel openings 91-97 in the interposer 90 also includes other rows of openings (e.g., 93-95) that are positioned and spaced for alignment between top die contact pads (e.g., 75-76) and bottom die contact pads (e.g., 86), depending on the relative alignment of the top and bottom die and interposer 90. As will be appreciated, the patterned array of openings 91-97 may be formed in the passive interposer structure 90 using any desired fabrication technique, such as a patterned mask and etch sequence, drilling cutting, punching, laser cuts, or the like. If formed with a conductive material, any holes in the passive interposer structure 90 may be lined with an insulator layer, such as by oxidizing an aluminum interposer layer or forming a dielectric layer around the hole surfaces. In selected embodiments, the passive interposer structure 90 is formed as mechanical support structure having patterned holes formed between top and bottom surfaces and without any horizontal conductors being formed on either surface of the passive interposer structure.

Figure 2:
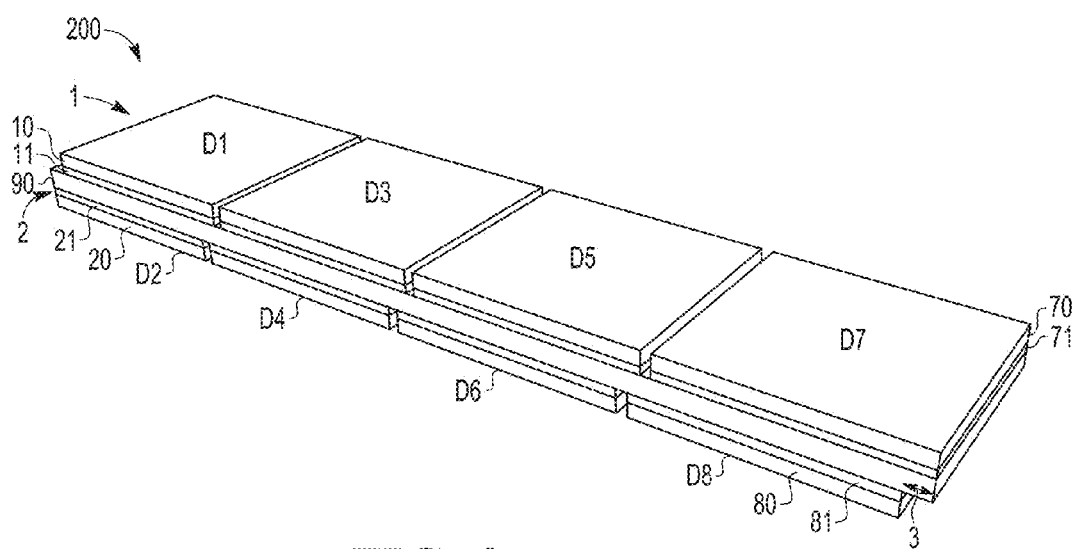
FIG. 2 illustrates the dual in-line memory module strips connected through the passive interposer support structure of FIG. 1.

Turning now to FIG. 2, there is shown a perspective view 200 of the top and bottom DIMM module strips 1, 2 of FIG. 1 which are mounted for electrical connection through the passive interposer support structure 90. After mounting DIMM module strip 2 to the interposer 90, but before mounting DIMM module strip 1, a pattern of conductors (e.g., conductive solder balls) are selectively formed in the patterned openings 91-97 to enable electrical connection between the DIMM module strips 1, 2. In addition, the top DIMM module strip 1 is offset from the bottom DIMM strip 2 by a lateral offset 3 in the first direction so that each die in the bottom DIMM strip 2 overlaps two adjacent dice in the top DIMM strip 1. With this overlapping arrangement, the die D1-D8 may be electrically connected across the conductive array of parallel conductors and contact pads formed on the interconnect surfaces and vertical conductors formed in a passive interposer structure 90. In particular and as enumerated in greater detail herein below, first and second die on opposite sides of the interposer 90 (e.g., D1, D2) may be electrically connected to one another across vertical conductors (e.g., solder ball conductors) formed in the patterned interposer openings (e.g., 96-97). In addition, adjacent die in one of the DIMM module strips D6, D8) may be electrically connected to one another across vertical conductors formed in the patterned interposer openings 93-95 which are connected to one or more parallel conductors formed on the overlapping die D5. By aligning the conductive redistribution lines and contact pads on the die D1-D8 with the patterned openings 91-97 in the passive interposer structure 90, one or more bus signals may be routed to each memory die in the strip DIMM without requiring the formation of any horizontal conductors on either surface of the passive interposer structure. In addition, the resulting low cost, high density DIMM reduces the board space requirements by connecting offset die clusters in multiple levels across a passive interposer structure which provides mechanical support and programmed solder ball connections in a flat DIMM assembly.

To illustrate an example fabrication sequence for forming a thin low profile dual in-line memory module, reference is now made to FIGS. 3A-F which illustrate partial cutaway side and plan views of various stages in the production. Though the illustrated DIMM structures are illustrated in simplified form, it will be appreciated that the actual DIMM structures will not necessarily conform to simplified depictions, but will instead depend on the specific fabrication process(es) and/or structures used.

Figure 3A:
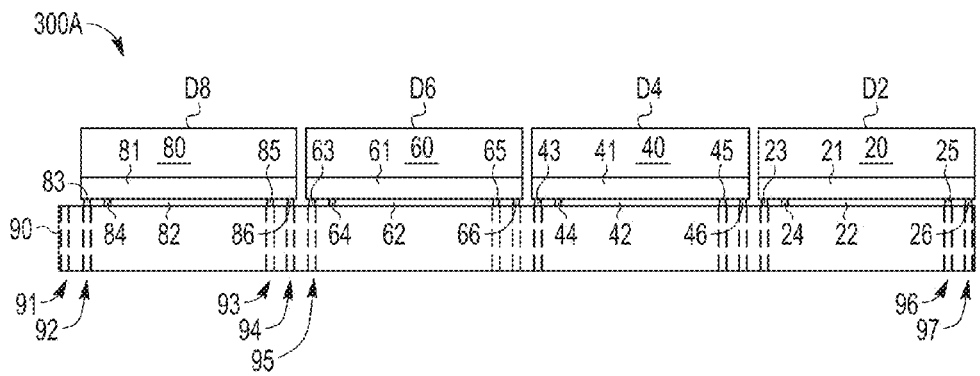
FIGS. 3A-F illustrate cross-section and plan views of a, fabrication sequence for forming a thin low profile dual in-line memory module in accordance with selected embodiments of the present disclosure.

Referring first to FIG. 3A, there is shown a partial cutaway side view 300A of a partial assembly in which a first die strip D2, D4, D6, D8 is mounted to a first surface of an interposer support structure 90, either in singulated or unsingulated form. When formed with a strip of unsingulated die (e.g., a 1×4 unsingulated die strip), the number of saw cuts is reduced from 16 to 4. Each die in the first die strip may be temporarily mounted to the interposer support structure 90, such as by using a temporary die attach mechanism, such as an adhesive layer (not shown). As disclosed herein, the passive interposer support structure 90 may be formed with one or more non-conductive layers (such as a dielectric, ceramic, or plastic) or conductive layers which have been rendered passive (e.g., by oxidation or formation of insulator layers on the outer surfaces), and includes a patterned array of openings 91-97 which extend through the passive interposer structure 90. Each die in the first die module strip includes a conductive array of parallel conductors and contact pads formed on the interconnect surfaces covering the substrate. For example, as depicted in FIGS. 1 and 3A, a first die D8 includes substrate 80 and interconnect layer(s) 81 on which is formed a conductive array of parallel conductors and contact pads which include one or more parallel conductors 82 running in a first direction to extend from first and second contact pads 83, 84 to one or more additional contact pads 85, 86 formed on opposite ends of the die D8. In similar fashion, FIG. 3A shows a second die D6 that includes a conductive array formed on the interconnect layer(s) 61 and substrate 60 which includes one or more parallel conductors 62 running in a first direction to extend between contact pads 63-66 formed on opposite ends of the die D6, while a third die D4 includes a conductive array formed on the interconnect layer(s) 41/substrate 40 with one or more parallel conductors 42 running in a first direction to extend between contact pads 43-46 formed on opposite ends of the die D4. In addition, a fourth die D2 includes a conductive array formed on the interconnect layer(s) 21/substrate 20 with one or more parallel conductors 22 running in a first direction to extend between contact pads 23-26 formed on opposite ends of the die D2. In mounting the plurality of die D2, D4, D6, D8 to the interposer support structure 90, the contact pads 23-26, 43-46, 63-66, 83-86 are aligned with at least some of the patterned array of openings (e.g., 91-97) formed to extend through the passive interposer structure 90.

Figure 3B:
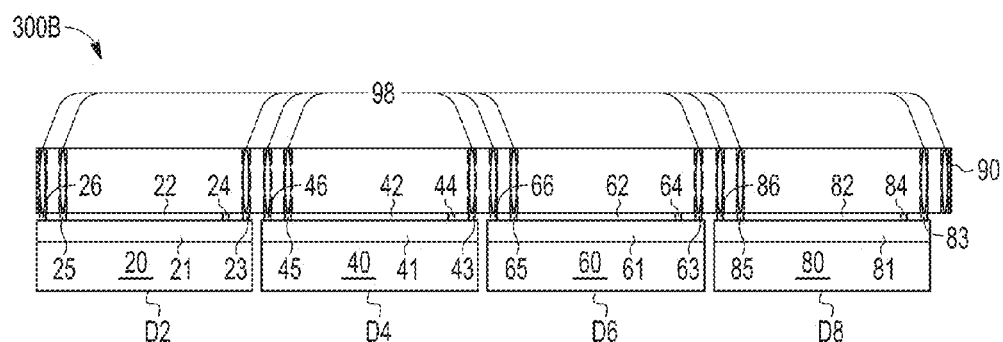

Referring next to FIG. 3B, there is shown a partial cutaway side view 300B of the partial assembly from FIG. 3A after being flipped so that the plurality of die D2, D4, D6, D8 are now located below the interposer support structure 90. In addition, vertical conductors 98 are selectively formed to fill at least some of the patterned array of openings 91-97 in the passive interposer structure 90. In selected example embodiments, the vertical conductors 98 may be formed by placing conductive solder balls to substantially fill the patterned openings 91-97.

Figure 3C:
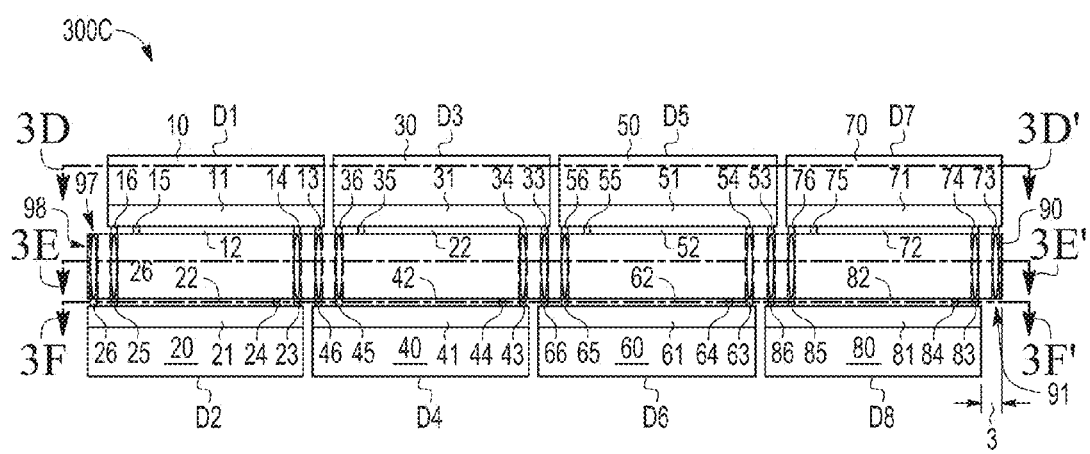

Referring now to FIG. 3C, there is shown a partial cutaway side view 300C of a strip DIMM assembly in which an additional die strip D1, D3, D5, D7 is mounted to a second, opposed surface of the interposer support structure 90 for electrical connection to the first die strip D2, D4, D6, D8. As illustrated, each die in the additional die strip D1, D3, D5, D7 is offset from a corresponding die in the first die strip D2, D4, D6, D8 by a lateral offset 3 so that each die on one level overlaps with two adjacent die in another level so that the die D1-D8 may be electrically connected across the conductive array of parallel conductors and contact pads formed on the interconnect surfaces and vertical conductors formed in a passive interposer structure 90. Each die in the additional die strip may be temporarily mounted to the interposer support structure 90, such as by using a temporary die attach mechanism. Each additional die includes a conductive array of parallel conductors and contact pads formed on the interconnect surfaces covering the substrate. For example, a first die D1 (including substrate 10 and interconnect layer(s) 11) is formed with one or more parallel conductors 12 running in a first direction to extend from first and second contact pads 13, 14 to one or more additional contact pads 15, 16 formed on opposite ends of the first die D1. In addition, die D3 includes a conductive array formed on the interconnect layer(s) 31 and substrate 30 which includes one or more parallel conductors 32 running in a first direction to extend between contact pads 33-36 formed on opposite ends of the die D3, while a die D5 includes a conductive array formed on the interconnect layer(s) 51/substrate 50 with one or more parallel conductors 52 running in a first direction to extend between contact pads 53-56 formed on opposite ends of the die D5, and die D7 includes a conductive array formed on the interconnect layer(s) 71/substrate 70 with one or more parallel conductors 72 running in a first direction to extend between contact pads 73-76 formed on opposite ends of the die D7. In mounting the additional die strip D1, D3, D5, D7 to the interposer support structure 90, the contact pads 13-16, 33-36, 53-56, 73-76 are aligned with at least some of the patterned array of openings (e.g., 91-97) formed to extend through the passive interposer structure 90. With this alignment, the vertical conductors 98 may be implemented as solder ball conductors 98 in the patterned openings 91-97 that may be re-formed or otherwise processed to make electrical contact between the contact pads on the die D1-D8. In selected embodiments such as shown in FIG. 3C, electrical contact may be established by reflowing the conductive solder balls 98 to substantially fill the patterned openings 91-97 and otherwise make electrical contact between the contact pads 23-26, 43-46, 63-66, 83-86 on the first die module strip D2, D4, D6, D8 and the corresponding contact pads 13-16, 33-36, 53-56, 73-76 in the additional die strip D1, D3, D5, D7.

Figure 3D:
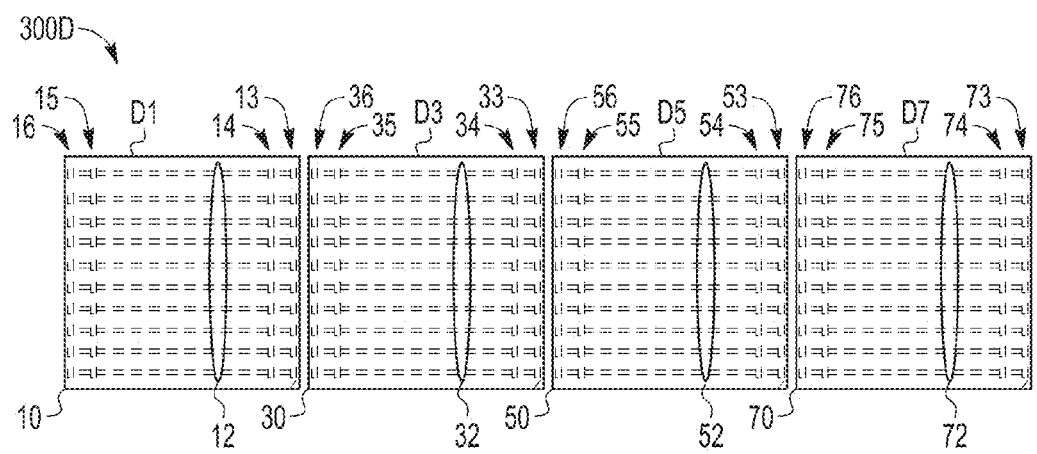

To illustrate additional details for selected embodiments of the present disclosure, reference is now made to FIG. 3D which illustrates a plan view 300D of the additional die strip D1, D3, D5, D7 shown in FIG. 3C taken along view line 3D-3D'. Viewed "down" through the substrates 10, 30, 50, 70 of the additional die strip D1, D3, D5, D7, the conductive array of conductor lines and contact pads 12-16, 32-36, 52-56, 72-76 are indicated with dashed back edge lines to illustrate that each conductor line 72 runs in a first direction to extend from contact pads (e.g., 73, 74) to additional contact pads (e.g., 75, 76) formed on the opposite end of the die (e.g., D7). In addition, multiple parallel conductor lines may be arrayed to connect contact pads on opposite ends of the die, though the conductor lines may have non-linear paths if desired.

Figure 3E:
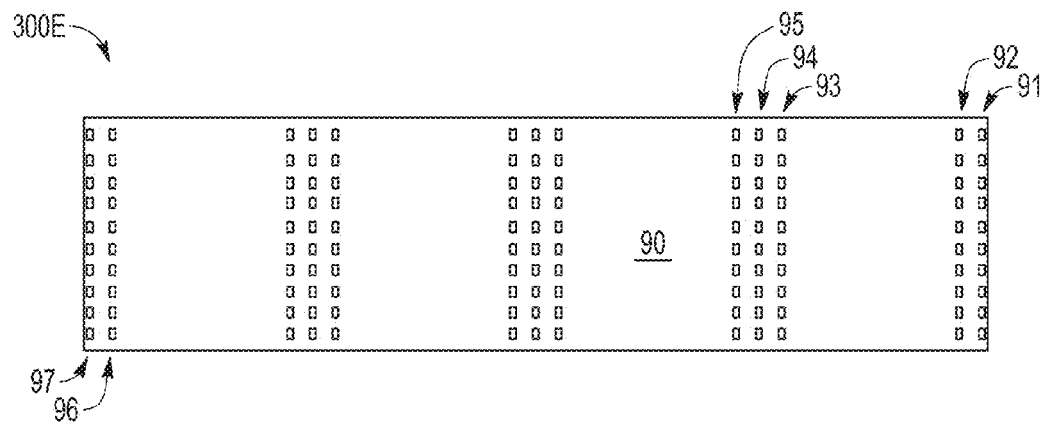

To illustrate additional details for selected embodiments of the present disclosure, reference is now made to FIG. 3E which illustrates a plan view 300E of the passive interposer support structure 90 shown in FIG. 3C taken along view line 3E-3E' to illustrate the location of the patterned array of openings 91-97 without also showing the vertical conductors 98 formed therein. Viewed "down" through the interposer 90, the patterned array of openings 91-97 are positioned to extend through the passive interposer structure 90 and to be aligned at least in part with contact pads 13-16, 33-36, 53-56, 73-76 in the additional die strip D1, D3, D5, D7 (shown in FIG. 3D). For example, the passive interposer support structure 90 includes first and second parallel rows of openings 91, 92 which are positioned and spaced for alignment with the contact pad rows 73, 74 on the top die D7. In addition, a third row of openings 93 in the passive interposer support structure 90 is positioned and spaced for alignment with the contact pad row 76 on the top die D7, while fourth and fifth parallel rows of openings 94, 95 in the passive interposer support structure 90 are positioned and spaced for alignment with the contact pad rows 53, 54 on the top die D5.

Figure 3F:
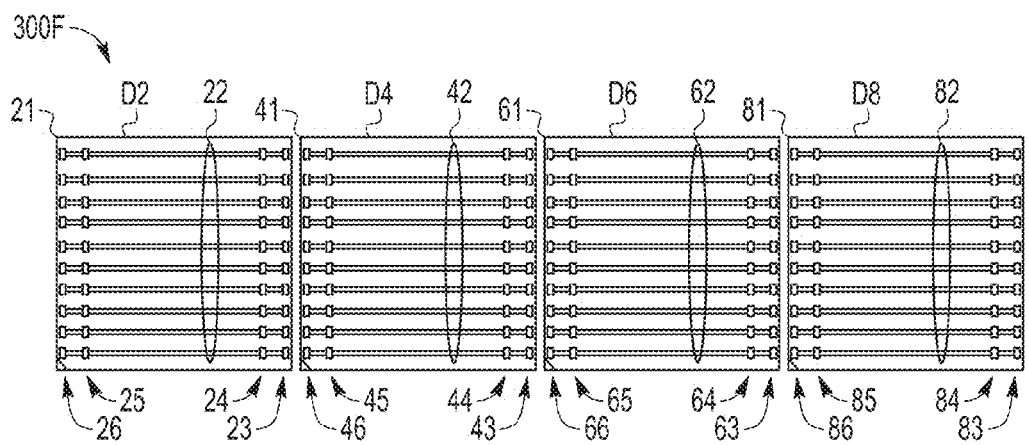

To illustrate additional details for selected embodiments of the present disclosure, reference is now made to FIG. 3F which illustrates a plan view 300F of the first die strip D2, D4, D6, D8 shown in FIG. 3C taken along view line 3F-3F. Viewed "down" on the first die strip D2, D4, D6, D8, the conductive array of conductor lines and contact pads 22-26, 42-46, 62-66, 82-86 are shown in plan view to illustrate that each conductor line (e.g., 82) runs in a first direction to extend between contact pads (e.g., 83, 84, 85, 86) formed on the opposite end of the die (e.g., D8). In addition, multiple parallel conductor lines may be arrayed to connect contact pads on opposite ends of the die, though the conductor lines may have non-linear paths if desired. From the plan view 300F, it can be seen that the contact pads 23-26, 43-46, 63-66, 83-86 in the first die strip D2, D4, D6, D8 are positioned for alignment with at least some of the patterned array of openings 91-97 (shown FIG. 3E). For example, a first row of contact pads 83 in the bottom die D8 is positioned and spaced for alignment with the second row of openings 92 in the passive interposer support structure 90. In addition, third and fourth rows of contact pads 85, 86 in the bottom die D8 are positioned and spaced for alignment with the third and fourth rows of openings 93, 94 in the passive interposer support structure 90, while a first row of openings 63 in the bottom die D6 is positioned and spaced for alignment with the fifth row of openings 95 in the passive interposer support structure 90.

In the strip DIMM assembly illustrated with reference to FIGS. 3A-F, only four die are shown as being attached to each side of the interposer 90. However, it will be appreciated that additional or fewer die may be attached to each side of the interposer 90. In addition, the positioning of the die strips in relation to the interposer 90 may leave one or more of the peripheral openings (e.g., 91, 97) exposed and uncovered by any die. Using the vertical conductor 98 in the exposed opening 97), an input/output signal(s) may be routed to the any die on the strip DIMM assembly by using one or more parallel conductors 12, 22, 32, 42, 52, 62, 72, 82 along with electrically connected contact pads 13-16, 23-26, 33-36, 43-46, 53-56, 63-66, 73-76, 83-86 and vertical conductors 98, as needed. For example one or more signals input at the vertical conductor 98 in the exposed opening 97 may be routed to die D6 along conductor(s) 22 on die D2, up through one or inure vertical conductors 98 in interposer 90 to the contact pad(s) 14 on die D1, along conductor(s) 12 on die D1 to contact pad(s) 13, down through one or more vertical conductors 98 in interposer 90 to the contact pad(s) 46 on die D4, along conductor(s) 42 on die D4 to contact pad(s) 43, up through one or more vertical conductors 98 in interposer 90 to the contact pad(s) 34 on die D3, along conductor(s) 32 on die D3 to contact pad(s) 33, and down through one or more vertical conductors 98 in interposer 90 to the contact pad(s) 66 on die D6. With this overlapping arrangement of offset die strips, individual die in the strip DIMM assembly are electrically connected across the conductive array of conductor lines and contact pads 12-16, 22-26, 32-36, 42-46, 52-56, 62-66, 72-76, 82-86 and vertical conductors 98 formed in a passive interposer 90, all without requiring the formation of any horizontal conductors on either surface of the passive interposer 90.

Figure 4:
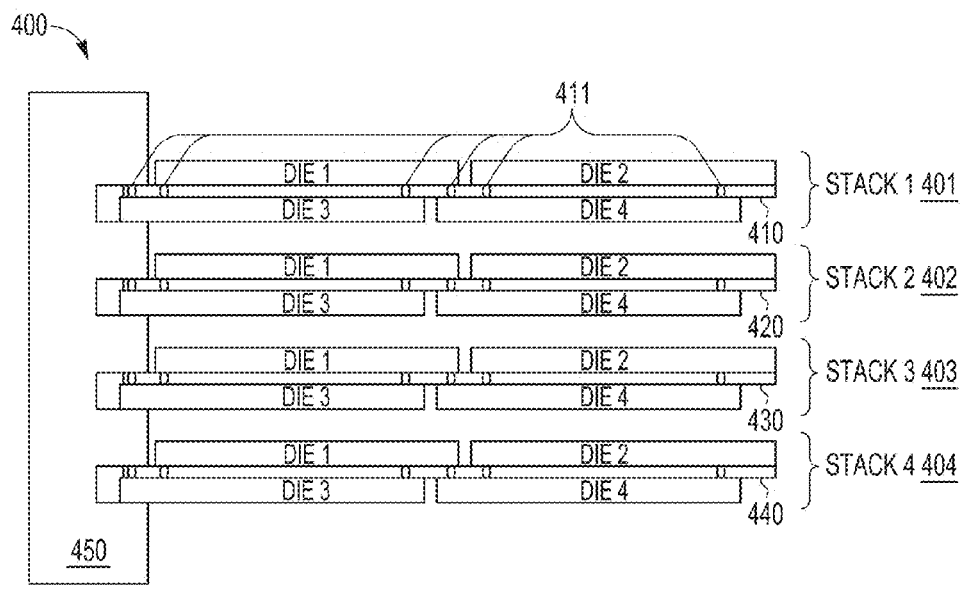
FIG. 4 illustrates a side view of a plurality of dual in-line memory module stacks mounted in an edge connect socket assembly.

As will be appreciated, the thin and low profile strip module DIMM assembly described herein may be advantageously deployed in a variety of different configurations or applications. For example, FIG. 4 illustrates a side view 400 of a plurality of memory module stacks 401-404 mounted in an edge connect socket assembly 450, such as may be used in an information processing system. Though illustrated in simplified form, each DIMM stack (e.g., 401) includes a plurality of integrated circuit die which are assembled and mounted to an interposer template structure (e.g., 410), with Die 1 and Die 2 mounted on top and Die 3, and Die 4 mounted below in offset positions. Through vertical conductor structures (e.g., 411) formed in the interpose template structure (e.g., 410) and the conductive array of conductor lines and contact pads formed on each die (not shown), the die in the DIMM stack 401 are electrically connected to one another. Each die stack is assembled and attached to openings formed in the edge connect socket assembly 450. As illustrated, the edge connect socket assembly 450 serves as a module substrate by providing a plurality of connection features or slots, each for receiving one of the DIMM stacks 401-404. As will be appreciated, the edge connect socket assembly 450 may be formed with any desired structure, such as a printed circuit board, mounting assembly, optical backplane structure, or the like. In selected embodiments, the edge connect socket assembly 450 may include any number of slots for receiving any number of DIMM stacks. With this arrangement, each interposer template structure 410, 420, 430, 440 in the DIMM stacks 401-404 may include one or more exposed vertical conductor structures which may function as input/output signal line(s) when placed into a slot in the edge connect socket assembly 450, thus edge mounting the DIMM stack. Though not shown, each of the edge mounted DIMM stacks 401-404 may include additional edge connectors and/or contacts which may be used to provide electrical and/or optical connections from electronic circuits (not shown) within each DIMM stack to circuit/conductors (not shown) in the edge connect socket assembly 450. In addition or in the alternative, electrically conductive devices (such as solder ball, copper pillars, or flip-chip conductors) formed on each DIMM stack (not shown) can be used to electrically connect the DENIM stack to the edge connect socket assembly 450. Mechanical support structures for attaching the edge mounted DIMM stacks 401-404 to the edge connect socket assembly 450 are not shown.

Figure 5:
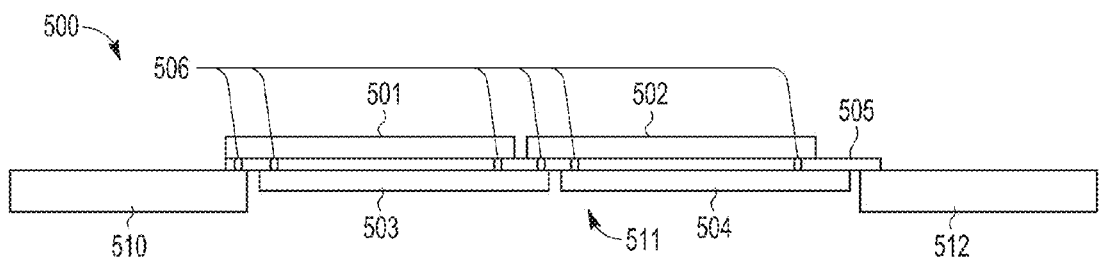
FIG. 5 illustrates a side view of a dual in-line memory module mounted on a board assembly.

Another deployment configuration for the thin and low profile strip DIMM assembly described herein is illustrated in FIG. 5 which shows a side view 500 of a DIMM 501-506 mounted on a board assembly 510, 512. Illustrated in simplified form, the strip DIMM 501-506 includes a plurality of integrated circuit die 501-504 which are assembled and mounted as offset die clusters on the top and bottom of an interposer template structure 505. In particular, top die 501, 502 are mounted on top of the interposer template structure 505, and bottom die 503, 504 are mounted below in offset positions. Connected together through vertical conductor structures 506 formed in the interpose template structure 505, the die 501-504 communicate with one another along a conductive array of conductor lines and contact pads formed on each die (not shown). The strip DIMM 501-506 is positioned in an opening 511 formed in the board assembly structure 510, 512 and attached using an attachment or adhesive mechanism (not shown) formed between the interposer template structure 505 and the board assembly structure 510, 512. With this arrangement, the interposer template structure 505 may include one or more exposed vertical conductor structures on a peripheral edge which function as input/output signal line(s) when connected to the board assembly structure 510, 512. Though not shown, the strip DIMM may include additional connectors and/or contacts which may be used to provide electrical and/or optical connections from electronic circuits (not shown) within the strip DIMM to circuit/conductors (not shown) in the board assembly structure 510, 512. By positioning the strip DIMM to be at least partially recessed within the opening 511 formed in the board assembly structure 510, 512, a more compact, low profile DIMM assembly is provided.

Figure 6:
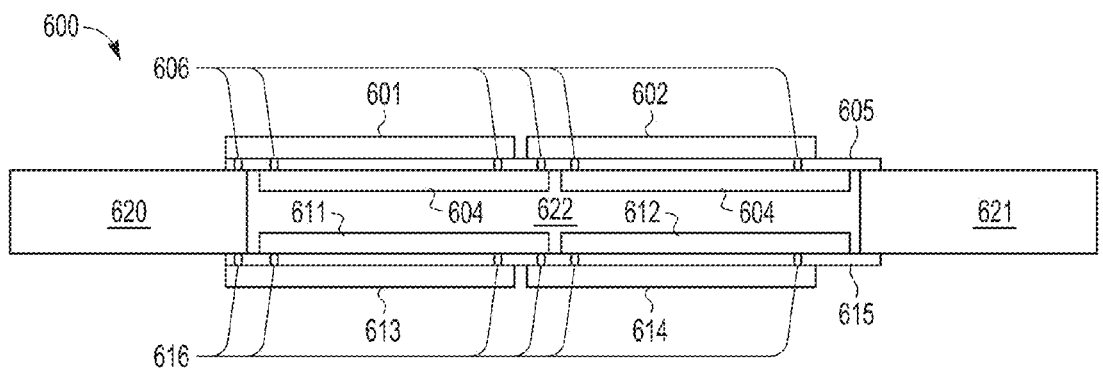
FIG. 6 illustrates a side view of a plurality of dual in-line memory module stacks mounted on a board assembly.

Depending on the depth of the opening formed in the board assembly structure, additional strip DIMMs may be mounted. For example, FIG. 6 illustrates a side view 600 of a plurality of dual in-line memory module stacks 601-606, 611-616 mounted on a hoard assembly 620-621. Similar to FIG. 5, a first strip DIMM 601-606 includes a plurality of integrated circuit die 601-604 which are mounted as offset die clusters on the top and bottom of an interposer template structure 605 which provides electrical connection between the dice 601-604 through vertical conductor structures 606 formed therein and which is positioned in an opening 622 for recessed attachment to the top of the board assembly structure 620, 621 using an attachment or adhesive mechanism (not shown). In addition, a second strip DIMM 611-616 includes offset die clusters 611-614 mounted as on the top and bottom of an interposer template structure 615 which provides electrical connection between the dice 611-614 through vertical conductor structures 616 formed therein. Since the depth of the opening 622, is large enough to fit another layer of dice, the second strip DIMM 611-616 is positioned in the bottom of the opening 622 for recessed attachment to bottom top of the board assembly structure 620, 621. In this deployment configuration, a plurality of strip DIMMs are positioned to be at least partially recessed within the opening 622 formed in the board assembly structure 620, 621 to provide a compact, low profile DIMM assembly.

Figure 7:
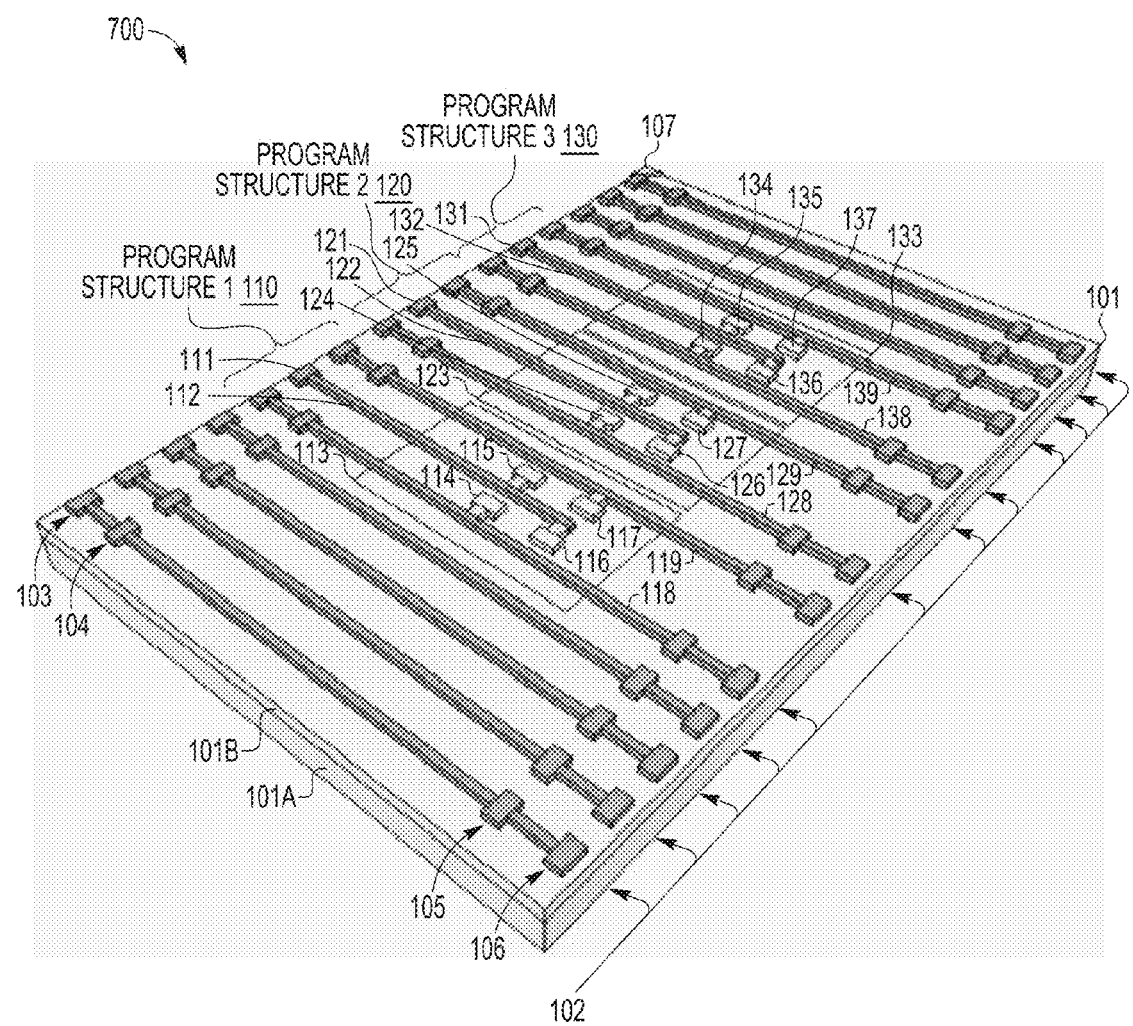
FIG. 7 illustrates a perspective view of a memory die with redistribution lines and contact pads and one or more programming structures symmetrically disposed on an upper interconnect surface.

In accordance with selected embodiments disclosed herein, a strip DIMM is formed by mounting and electrically connecting offset DIMM module strips on opposed sides of passive interposer, thereby forming a bus line that is shared by all dice on the strip DIMM. By forming the shared bus line with conductive redistribution lines formed on each die's surface to connect contact pads arrayed on opposite ends of the die, and then connecting the conductive redistribution lines through solder ball connectors formed in the passive interposer, an input/output voltage or signal may be routed to or from every die in the strip DIMM. While such a shared bus may include a dedicated address or selection line for each die in the DIMM strip, there is disclosed herein a method and apparatus for using a plurality of n select lines to individually select one of a plurality of 2n die by including n programmable selection structures on each die which are connected through the programmed solder ball conductors in the passive interposer to select an individual die from the strip DIMM. The select lines may include one or more of such common signals as CE, CS, CKE, CLK, their complements, and the like. For example, FIG. 7 illustrates a perspective view 700 of a memory die 101 with redistribution lines 102, contact pads 103-106, and one or more programming structures 110, 120, 130 symmetrically disposed on an upper interconnect surface of the die 101. The die 101 includes a substrate 101A, one or more interconnect layers 101B formed on the substrate 101A, and an alignment mark or feature 107 formed at a predetermined location on the die 101. Though illustrated in simplified form as a raised triangle-shaped feature at a corner of the die 101, it will be appreciated that the alignment mark 107 may be implemented with any structure that can be used to align the die during fabrication or assembly.

On a top surface of the die 101, an array of conductive redistribution lines 102 is formed to connect one or more original contact pads 103 to one or more redistribution contact pads 104-106 which may be arrayed on opposite ends of the die 101. As formed, the redistribution lines 102 and contact pads 103-106 enable one or more bus signals applied at the original contact pads 103 to be routed along the redistribution lines 102 to the redistribution contact pads 104-106 on the die 101. In addition, the redistribution lines 102 and contact pads 103-106 may be formed to include one or more programming structures 110, 120, 130 for selective routing of select signals applied at the original contact pads 111, 121, 131 to selection contact pads 114-117, 124-127, 134-137 on the die 101. A first programming structure 110 includes a contact pad 111 and redistribution line 112 connected to a contact pad array 113 having first selection contact pads 115, 116 connected to the redistribution line 112, and second selection contact pads 114, 117 connected, respectively to redistribution lines 118, 119. The second programming structure 120 may have an identical structure which includes a contact pad 121 and redistribution line 122 connected to a contact pad array 123 having first selection contact pads 125, 126 connected to the redistribution line 122, and second selection contact pads 124, 127 connected, respectively to redistribution lines 128, 129. A third programming structure 130 may also have an identical structure which includes a contact pad 131 and redistribution line 132 connected to a contact pad a. 133 having first selection contact pads 135, 136 connected to the redistribution line 132, and second selection contact pads 134, 137 connected, respectively to redistribution lines 138, 139. With each of the programming structures 110, 120, 130, select signals at any of the redistribution lines (e.g., 112, 118, or 119) may be routed to or from the connected selection contact pads (e.g., 114-117) on the die 101. For example, a programming structure (e.g., 110) may receive a select signal from an original contact pad (e.g., 111), from a redistribution contact pad (e.g., 104, 106) connected to a redistribution line (e.g., 118, 119), or from one of the selection contact pads (e.g., 114-117) when connected to another stacked die through the interposer structure as described more fully hereinbelow. As will be appreciated, the redistribution lines 102 that are not part of the programming structures 110, 120, 130 are shown as linear, parallel conductors which helps reduce resistance and or capacitance associated with such conductors. However, one or more of the redistribution lines 102 may be routed around the programming structures 110, 120, 130 with a non-linear path, provided that the relative alignment positioning of any contact pads 103-106 is maintained.

Figure 8A:
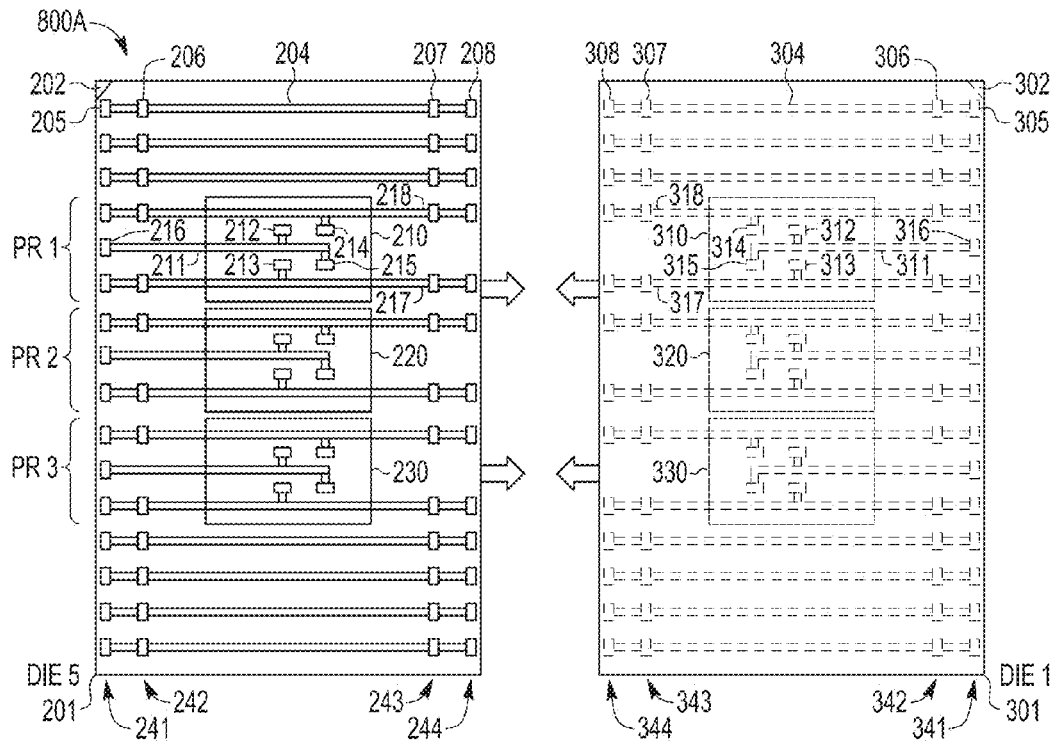
FIGS. 8A-B illustrate top views of first memory die and second flipped memory die as they are moved into offset positions for connection through a passive interposer structure in accordance with selected embodiments of the present disclosure.
Figure 8B:
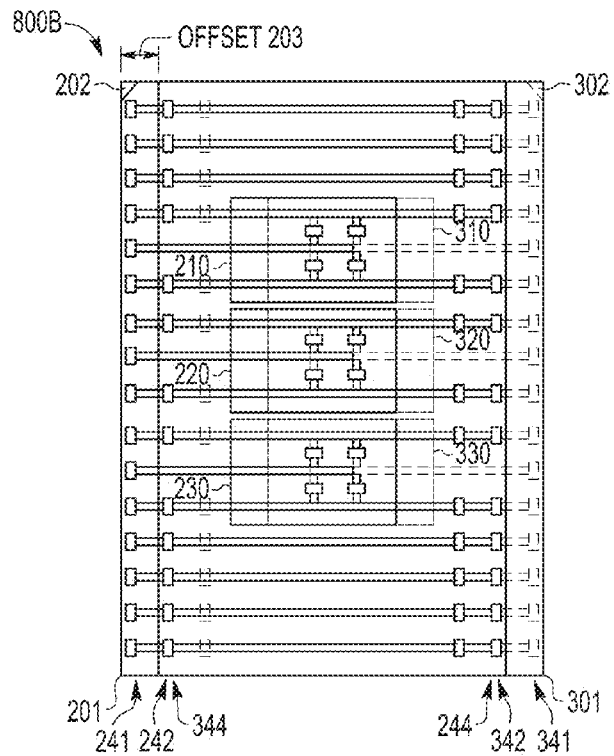

To illustrate an example die stacking arrangement for connecting two die across an interposer structure, reference is now made to FIGS. 8A-B which illustrate top views 800A, 800B, respectively, of first memory die 201 (e.g., Die 5) and second flipped memory die 301 (e.g., Die 1) as they are moved into offset positions for connection through a interposer structure (not shown) in accordance with selected embodiments of the present disclosure. In FIG. 8A, the first and second memory die 201, 301 are laterally displaced from one another and positioned for movement into overlapping positions (show in FIG. 8B), with the first memory die 201 on the bottom facing up and the second memory die 301 on the top facing down. Similar to the memory die 101 shown in FIG. 7, the first memory die 201 includes an alignment mark 202, an array of redistribution lines (e.g., 204), contact pads (e.g., 205-208) arranged in rows 241-244, and programming region structures 210, 220, 230 symmetrically disposed on an (upward facing) surface of the die 201. The first programming region structure 210 is connected to a contact pad 216 via redistribution line 211, and includes first selection contact pads 212, 215 connected to the redistribution line 211, and second selection contact pads 213, 214 connected, respectively to redistribution lines 217, 218. The second and third programming region structures 220, 230 are shown as having identical structures. The second memory die 301 is identical to the first memory die 201, but is shown as being flipped to be face-down (as indicated by the dashed lines). As such, the second memory die includes an alignment mark 302, an array of redistribution lines (e.g., 304), contact pads (e.g., 305-308) arranged in rows 341-344, and programming region structures 310, 320, 330 symmetrically disposed on a (downward facing surface of the die 301. The first programming region structure 310 is connected to a contact pad 316 via redistribution line 311, and includes first selection contact pads 312, 315 connected to the redistribution line 311, and second selection contact pads 313, 314 connected, respectively to redistribution lines 317, 318. The second and third programming region structures 320, 330 are shown as having identical structures.

By forming the first and second die 201, 301 as identical die with symmetrically disposed programming region structures 210/220/230, 310/320/330 on each die that are offset from the die center by a predetermined offset spacing 203, the programming region structures 210, 220, 230 on the bottom first memory die 201 are aligned with the programming region structures 310, 320, 330 on the top second memory die 301 when aligned in offset overlapping positions, as shown in FIG. 8B. In this offset overlapping position, the first and second memory die 201, 301 are offset from one another by an offset spacing 203 so that contact pads 241 on the first memory die 201 are not covered. However, the contact pads 242, 244 on the first memory die 201 are aligned with the contact pads 344, 342 on the second memory die 301, leaving exposed the contact pads 341 on the second die 301. With this offset alignment, electrical connections between aligned contact pads in the stacked memory die 201, 301 may be established by forming conductor paths in the interposer structure between the aligned contact pads. For example, an interposer structure that is sandwiched between the stacked memory die 201, 301 may include an array of openings that are positioned for possible alignment with the contact pads so that the electrical connections may be established by forming solder ball conductors in the appropriate openings where an electrical connections are to be made. As disclosed herein, such electrical connections can be used to redistribute signals between the stacked die 201, 301 and/or to route select signals to or through selective programming of the aligned programming region structures 210/220/230, 310/320/330.

Figure 9:
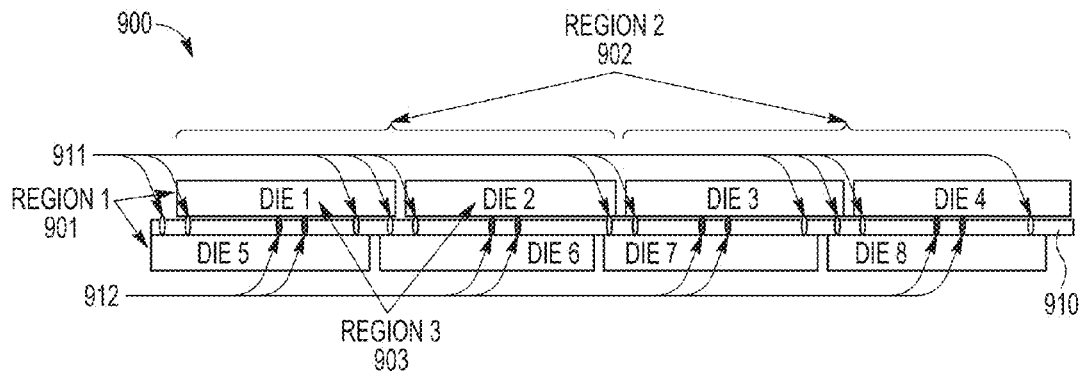
FIG. 9 illustrates a cross sectional side view of a low profile strip dual in-line memory module with a programmed interposer template structure in accordance with selected embodiments of the present disclosure.

To illustrate an example embodiment for establishing electrical connections between stacked die, reference is now made to FIG. 9 which shows a simplified cross sectional side view 900 of a low profile strip DIMM in which a plurality of top die (Die 1, Die 2, Die 3, Die 4) and a plurality of bottom die (Die 5, Die 6, Die 7, Die 8) are mounted in offset on opposite sides of programmed interposer template structure 910 in which electrical connections 911, 912 are formed. Though shown in simplified schematic form for purposes of illustrating the relative position of the dice and interposer structure 910, it will be appreciated that the plurality of top die may be downward facing die having contact pads, redistribution lines, and programming region structures (not shown) as described hereinabove. By the same token, the plurality of bottom die may be upward facing die having aligned contact pads, redistribution lines, and programming region structures (not shown). With this offset stacking arrangement, contact pads at the peripheral ends of overlapping or stacked die (e.g., Die 1 and Die 5) may be connected through electrical connections 911 (e.g., solder balls) formed in the interposer structure 910. In addition, contact pads at the interior programming region structures of overlapping or stacked die (e.g., Die 6 and Die 2) may be connected through electrical connections 912 (e.g., solder halls) formed in the interposer structure 910, thereby programming the routing of signals through the programming region structures.

Figure 10:
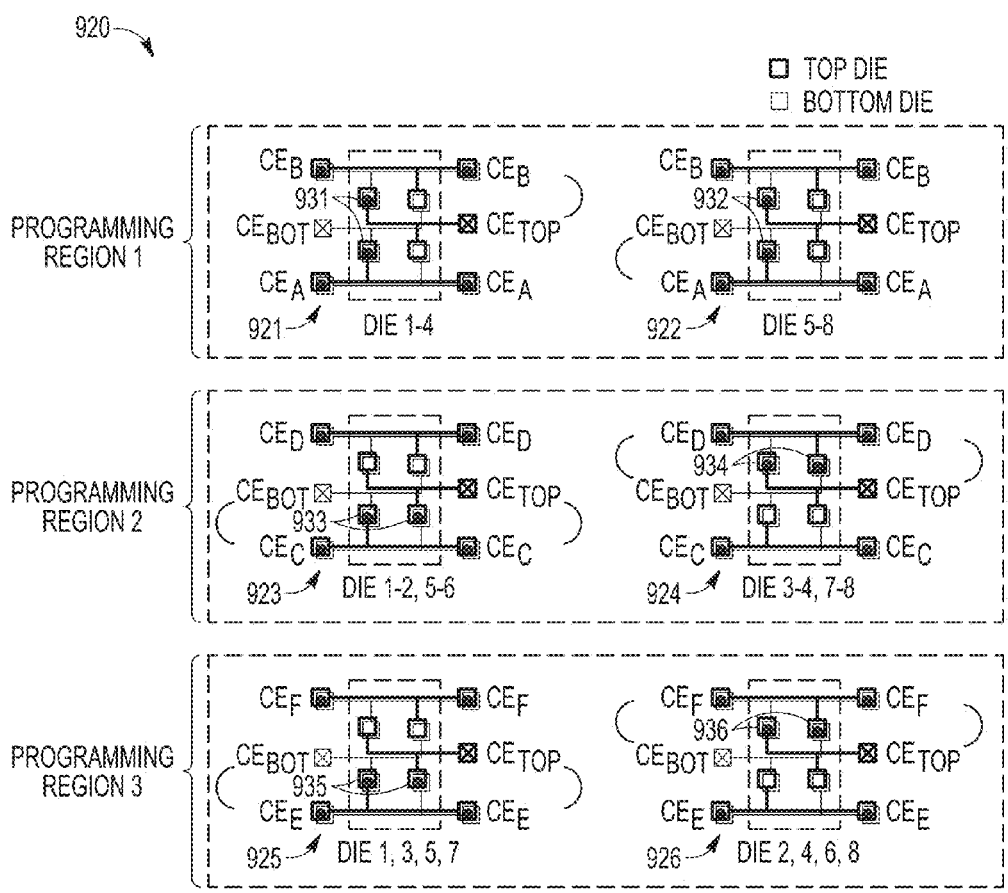
FIG. 10 illustrates example programming region connections for an interposer template structure in accordance with selected embodiments of the present disclosure.

Using the connections 912 to the programming region structures, each of the eight die formed on a strip DIMM may be individually selected or addressed by applying three selection signals (e.g., chip enable signals) to three programming region structures formed on each die to effectively choose between the Region 1 901 options (top or bottom), the Region 2 902 options (left die pair or right die pair), and the Region 3 903 options (first or second die). As will be appreciated, the specific arrangement of electrical connections 912 used to program the routing of signals at the program region structures will vary, depending on how the different die to be addressed or selected are arranged on the strip DIMM. However, an example embodiment for programming the routing of signals to the programming region structures in the low profile strip DIMM such as shown in FIG. 9 is shown in FIG. 10 which illustrates a simplified schematic representation 920 of example solder ball programming arrays 921-926 used for three programming region structures in an interposer template structure in accordance with selected embodiments of the present disclosure. In each depicted programming region structure, the contact pads and electrical connections therebetween for the bottom die are indicated in thin black lines and conform to the circuit arrangement of the programming region structure 210 shown in FIG. 8A. Likewise, contact pads and electrical connections therebetween for the top die are indicated in thick black lines and conform to the circuit arrangement of the programming region structure 310 shown in FIG. 8A.

In a first programming region (Programming Region 1), a solder ball programming array 921 is used for Die 1-4 in which solder ball conductors at the contact pads 931 connect a first redistribution line (e.g., CEA) to a selection contact pad on the bottom die (e.g., CEBOT), and also connect a second redistribution line (e.g., CEB) to a selection contact pad on the top die (e.g., CETOP). In addition, a solder ball programming array 922 is used for Die 5-8 in which solder ball conductors at the contact pads 932 connect the first redistribution line (e.g., CEA) to the selection contact pad on the bottom die (e.g., CEBOT), and also connect the second redistribution line (e.g., CEB) to the selection contact pad on the top die (e.g., CETOP).

In a second programming region (programming Region 2), a solder ball programming array 923 is used for Die 1-2 and 5-6 in which solder ball conductors at the contact pads 933 connect a first redistribution line (e.g., CEC) to a selection contact pad on the bottom die (e.g., CEBOT) and to a selection contact pad on the top die (e.g., CETOP), but do not otherwise connect a second redistribution line (e.g., CED) to either selection contact pad. However, for Die 3-4 and 7-8, a solder ball programming array 924 includes solder ball conductors at the contact pads 934 to connect the second redistribution line (e.g., CED) to the selection contact pads on the top and bottom die (e.g., CEBOT and CETOP), but to otherwise not connect the first redistribution line (e.g., CEC) to the selection contact pads.

In a third programming region (Programming Region 3), a solder ball programming array 925 is used for Die 1, 3, 5, and 7 in which solder ball conductors at the contact pads 935 connect a first redistribution line (e.g., CEE) to a selection contact pad on the bottom die (e.g., CEBOT) and to a selection contact pad on the top die (e.g., CETOP), but do not otherwise connect a second redistribution line (e.g., CEF) to either selection contact pad. However, for Die 2, 4, 6, and 8, a solder ball programming array 926 includes solder ball conductors at the contact pads 936 to connect the second redistribution line (e.g., CEF) to the selection contact pads on the top and bottom die (e.g., CEBOT and CETOP), but to otherwise not connect the first redistribution line (e.g., CEE) to the selection contact pads.

Figure 11:
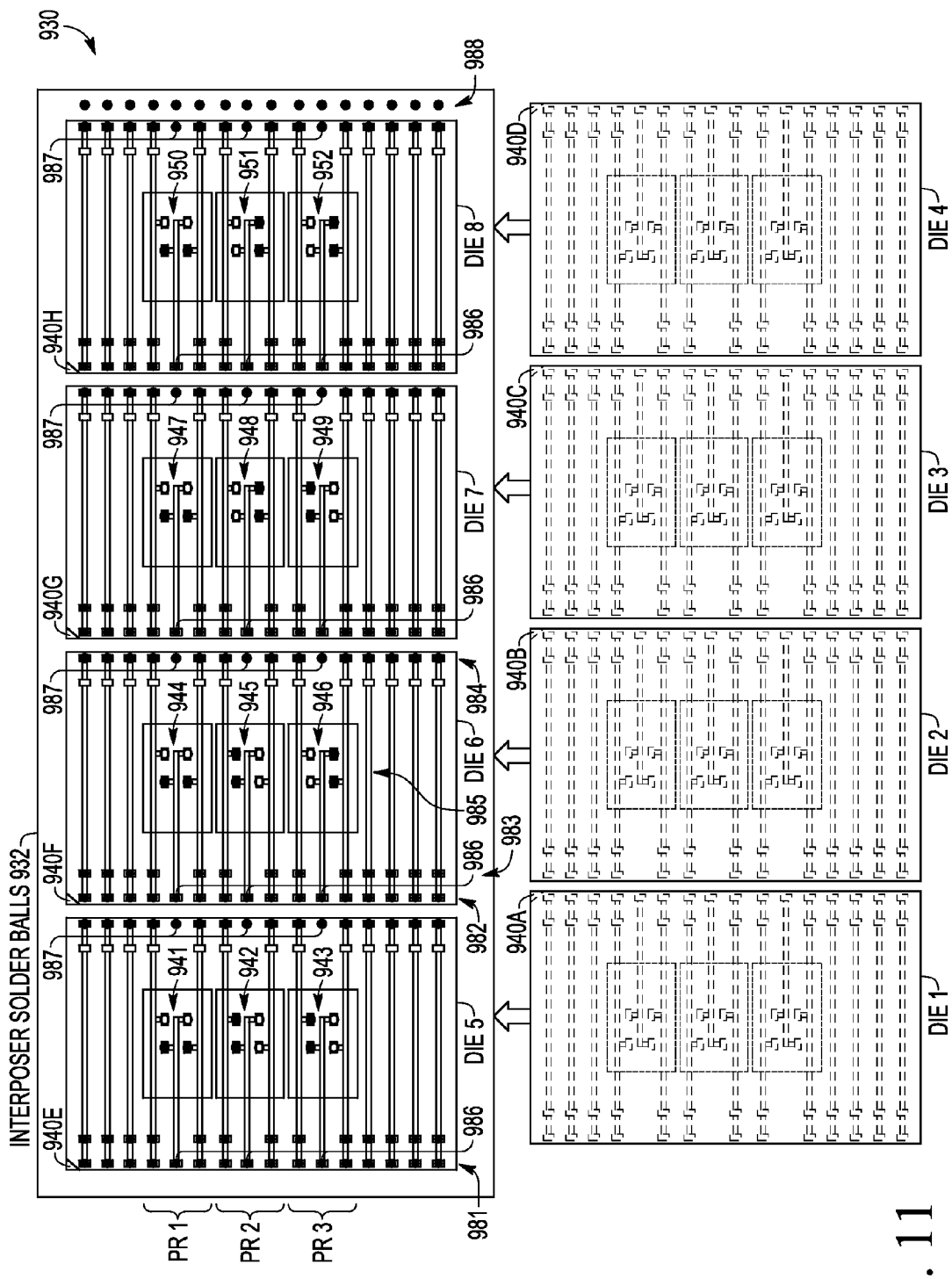
FIG. 11 illustrates a plan view of a plurality of face-up die covered by a programmed interposer template structure and a plurality of face-down die positioned adjacent to the programmed interposer template structure prior to being attached to form a low profile strip dual in-line memory module.

To illustrate selected example embodiments for using solder ball programming arrays to implement chip selection or addressing in a low profile strip DIMM, reference is now made to FIG. 11 which illustrates a plan view 930 of a plurality of face-up die (Die 5, Die 6, Die 7, Die 8) positioned under and covered by a programmed interposer template structure 932 in which solder ball conductors are formed to implement the example programming arrays 941-952. The plan view 930 also shows a plurality of face-down die (Die 1, Die 2, Die 3, Die 4) that are positioned in an offset position adjacent to the programmed interposer template structure 932 prior to being aligned and attached to form a low profile strip DIMM. As illustrated, each die includes an alignment mark 940A-H, as well as an array of redistribution lines, contact pads arranged in rows, and programming region structures symmetrically disposed on an (upward facing) surface of the die such as described in detail with reference to the memory die 101 depicted in FIG. 7. The face-up dice (Die 5, Die 6, Die 7, Die 8) have the conductor features indicated with solid lines, while the face-down dice (Die 1, Die 2, Die 3, Die 4) have been flipped over so that their conductor features are indicated with dashed lines. Once the face-down dice (Die 1, Die 2, Die 3, Die 4) are moved into alignment with the face-up dice (Die 5, Die 6, Die 7, Die 8) (as indicated by the direction arrows) and attached to the top of the programmed interposer template structure 932 to form the strip DIMM assembly, the aligned contact pads on the dice are connected by the solder ball conductors formed in the programmed interposer template structure 932 to establish signal paths through the strip DIMM assembly.

Formed with a suitably passive or non-conductive material, the interposer template structure 932 includes patterned openings (indicated with circles) which are formed in alignment with the selected contact pads of the face-up dice (Die 5, Die 6, Die 7, Die 8) as indicated in FIG. 11. Template structure 932 is shown as if it were transparent so that face up die 5-8 can be seen through the template. As indicated by the blackened circles, solder ball conductors may be selectively formed in the patterned openings, thereby establishing electrical connections between aligned contact pads in overlapping die. In particular, the patterned openings include a first row of patterned openings 981 formed on one end of the interposer template structure 932 which may be programmed with solder ball conductors to provide an external input/output signal path to Die 5. On the other end of the interposer template structure 932, an additional row of patterned openings 988 is formed in alignment with peripheral contact pads of the face-down Die 4. The patterned openings also include, for each of the face-up die (e.g., Die 6), a first row of openings (e.g., 982) formed over the peripheral contact pads on one side of the die, a second row of "jumper" openings (e.g., 983) formed over an adjacent row of redistribution contact pads, a third row of openings (e.g., 984) formed over the peripheral redistribution contact pads on the opposite side of the die, and an internal array of openings (e.g., 985) formed over the selection contact pads of the die's programming region structure. When programmed with solder ball connections, the second row of "jumper" openings (e.g., 983) is used with the first row of openings (e.g., 982) to provide a signal connection path across any gap between stacked overlapping die (e.g., Die 1 and Die 2). Solder ball programming of the internal array of openings in each die (e.g., 985) is also used to program the die's programming region structure. In the example depicted in FIG. 11, the example programming arrays 941-952 include solder ball conductors that are positioned and arranged to implement the solder ball programming array examples shown in FIG. 10. With this arrangement, the interposer template structure 932, may use the same template of patterned openings for each die and program those openings with solder ball conductors to establish signal routing paths to each die, including pre-selected chip enable connections to each die based on the position of the die on the interposer template structure 932.

After placing or programming the solder ball conductors in place and moving the face-down dice (Die 1, Die 2, Die 3, Die 4) into offset alignment with the face-up dice (Die 5, Die 6, Die 7, Die 8) for attachment to the top of the programmed interposer template structure 932, the face-down dice are stacked over the face-up die. In this configuration, the first row of solder ball connections (e.g., 982) form electrical connections between aligned contact pads on the stacked face-up die (e.g., Die 6) and overlying face-down die (e.g., Die 1), while the second row of solder ball connections (e.g., 983) form electrical connections between aligned contact pads on the stacked face-up die (e.g., Die 6) and overlying face-down die (e.g., Die 2). However, when the overlying face-down die (e.g., Die 2) does not include aligned redistribution contact pads (e.g., in the programming regions), then the first row of solder ball connections (e.g., 982) will include solder ball connections 986 that are only connected to the contact pads on the stacked face-up die (e.g., Die 6). Conversely, when the underlying face-up die (e.g., Die 6) does not include aligned redistribution contact pads (e.g., in the programming regions), then the third row of solder ball connections (e.g., 984) will include solder ball connections 987 that are only connected to the contact pads on the slacked face-down die (e.g., Die 2).

As will be appreciated, the strip dual in-line memory module apparatus, system, and fabrication methodology described herein provide low profile assembly of memory die clusters on opposed sides of an interposer template which is programmed with solder ball connections and provide mechanical support for the memory die clusters. In selected embodiments, the memory die clusters may be formed with very thin memory die, such as flash memory, though other memory die may be used. Selected embodiments of the interposer template are described with reference to a patterned non-conductive support structure having a minimum specified thickness (e.g., approximately 100 microns) that is sufficient to provide mechanical support and maintain solder ball connections without bending or flexing within a specified temperate range (e.g., 25-75° C.), though the required thickness of the interposer structure may vary, depending on the thickness and structural thickness of the die clusters. In a preferred embodiment the template structure 932 has approximately the same temperature coefficient of expansion as the Die 1-8 And while the solder ball programming region connections are illustrated with reference to using three programming regions to select or address one of eight die on a strip DIMM, additional or fewer programming regions may be programmed with different solder ball connections than shown to use n signal lines to select or address up to $2^n$ die.

By now it should be appreciated that there has been provided herein a memory module and associated method of assembly and operation. As disclosed the memory module includes a passive interposer support structure, a plurality of memory die, and a plurality of conductors for connecting the memory die together. The passive interposer support structure includes a plurality of openings formed between first and second opposed surfaces, and may be formed with a non-conductive exterior surface and/or a layer of dielectric, ceramic, or plastic material in which a patterned plurality of openings are formed between the first and second opposed surfaces. In selected embodiments, the interposer support structure has no conductors formed on the first or second opposed surfaces. On the first surface of the interposer support structure, a first plurality of memory die is attached, and a second plurality of memory die is attached to the second surface to be aligned in offset from the first plurality of memory die. The first and second plurality of memory die may be formed with identical flash memory die. In selected embodiments, the first plurality of memory die may be a first aligned strip of four face-down memory die separated from one another by a gap and attached on top of the passive interposer support structure at the first surface, and the second plurality of memory die may be a second aligned strip of four face-up memory die separated from one another by a gap and attached below the passive interposer support structure at the second surface. As formed, a plurality of conductors extends through the plurality of openings in the passive interposer support structure between the first and second plurality of memory die to form electrical connections therebetween. These conductors may be formed as solder ball conductors to electrically connect aligned contact pads on the first and second plurality of memory die. To this end, each memory die in the first and second plurality of memory die includes an attachment surface facing the passive interposer structure. On each attachment surface, a patterned array of conductors is formed with contact pads electrically connected to the plurality of conductors through the plurality of openings to define at least one bus conductor that is electrically connected to each memory die in the first and second plurality of memory die. In addition, the patterned array of conductors may include a plurality of programming region structures formed with an array of program contact pads and connector lines which are used to program a signal (e.g., n selection signals) for the first and second plurality memory die. In this way, n selection signals may be provided for selecting between $2^n$ memory die in the first and second plurality memory die. In selected embodiments, one or more of the memory modules may be connected to a printed circuit board and/or a recessed opening formed therein.

In another form, there is provided an apparatus and associated method of assembly and operation. As disclosed, the apparatus includes a non-conductive support structure, a plurality of attached memory die, and a plurality of conductors for connecting memory die together through the non-conductive support structure which has opposed first and second surfaces between which are formed a patterned array of openings. In selected embodiments, the non-conductive support structure may be formed with a layer of dielectric, ceramic, or plastic material and/or or a mechanical support layer having anon-conductive exterior surface. A plurality of up to $2^n$ memory die is attached to the first and second surfaces of the non-conductive support structure. In selected embodiments, each of the $2^n$ memory die is formed with an identical dual in-line memory die. Each memory die may include a plurality of select contact pads arranged in n programming templates, and redistribution conductor lines formed on an attachment face of each memory die. As formed, the redistribution conductor lines may be formed as a plurality of parallel lines extending in a linear or curved direction across the attachment face. In this configuration, the plurality of conductors (e.g., solder ball conductors) formed in the patterned array of openings connect the plurality of up to $2^n$ memory die in series and form n select lines in a continuous bus for selecting one of the plurality of up to $2^n$ memory die by electrically connecting selected select contact pads and redistribution conductor lines from the plurality of up to $2^n$ memory die. To enable the connection of the memory die, the patterned array of openings formed in the non-conductive support structure may include parallel rows of openings positioned for alignment with contact pads formed on opposed peripheral sides of each of the plurality of up to 2n memory die, and may also include an internal array of openings positioned for alignment with the plurality of select contact pads arranged in the n programming templates. In selected embodiments, the plurality of up to $2^n$ memory die include a first aligned strip of four face-down memory die separated from one another by a gap and attached on top of the non-conductive support structure at the first surface, and also include a second aligned strip of four face-up memory die separated from one another by a gap and attached below the non-conductive support structure at the second surface. In such embodiments, each memory die has n=3 programming templates located at an interior position of said memory die. Each programming template may include four select contact pads formed on the attachment face of said memory die; a first redistribution conductor line forded on the attachment face of said memory die and electrically connected to a first of the four select contact pads; a second redistribution conductor line formed on the attachment face of said memory die and electrically connected to a second and third of the four select contact pads; and a third redistribution conductor line formed on the attachment face of said memory die and electrically connected to a fourth of the four select contact pads. In addition, each memory die may include contact pads formed on opposite ends of a plurality of the redistribution conductor lines, and jumper contact pads forded on at least one end of the plurality of the redistribution conductor lines to provide a signal connection path across any gap between stacked overlapping die attached to an opposite face of the non-conductive support structure. In selected embodiments, the non-conductive support structure and the plurality of up to $2^n$ memory die have substantially the same temperature coefficient of expansion.

Although the described exemplary embodiments disclosed herein are directed to the design and assembly of a low profile strip dual in-line memory module, the present invention is not necessarily limited to the example embodiments illustrate herein, and various embodiments of the circuitry and methods disclosed herein may be implemented with other devices and circuit components. Thus, the particular embodiments disclosed above are illustrative only and should not be taken as limitations upon the present invention, as the invention may be modified and practiced in different but equivalent manners apparent to those skilled in the art having the benefit of the teachings herein. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising." or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A memory module, comprising:
   a passive interposer support structure formed with one or more passive layers that are not electrically conductive in which is formed a plurality of openings between first and second opposed surfaces;
   a first plurality of memory die attached to the first surface of the passive interposer support structure;
   a second plurality of memory die attached to the second surface of the passive interposer support structure to be aligned in offset from the first plurality of memory die; and
   a plurality of conductors extending through the plurality of openings in the passive interposer support structure between the first and second plurality of memory die;
   wherein the attachment surfaces of each of the first plurality of memory die and the second plurality of memory die define a perimeter;
   where each memory die in the first and second plurality of memory die comprises die conductive structures including contact pads and a patterned array of conductors, where each memory die in the first and second plurality of memory die comprises an attachment surface facing the passive interposer structure on which the patterned array of conductors is formed with contact pads electrically connected to the plurality of conductors through the plurality of openings to define at least one bus conductor that is electrically connected to each memory die in the first and second plurality of memory die;

wherein each bus conductor of the at least one bus conductor includes conductive structures of the die conductive structures and includes non die conductive structures;

for each bus conductor of the at least one bus conductor, except for the plurality of conductors through the plurality of openings, all of the non die conductive structures of the bus conductor between the memory die of the first and second plurality of memory die are located between the attachment surfaces of the first plurality of memory die and the first surface of the passive interposer within the perimeters of the attachment surfaces of the first plurality of memory die or are located between the attachment surfaces of the second plurality of memory die and the second surface of the passive interposer within the perimeters of the attachment surfaces of the second plurality of memory die.

2. The memory module of claim 1, where the interposer support structure comprises a non-conductive exterior surface.

3. The memory module of claim 1, where the interposer support structure comprises a layer of dielectric material in which a patterned plurality of openings are formed between the first and second opposed surfaces.

4. The memory module of claim 1, where the memory die in the first and second plurality of memory die are formed with identical flash memory die.

5. The memory module of claim 1, where the first plurality of memory die comprises a first aligned strip of four face-down memory die separated from one another by a gap and attached on top of the passive interposer support structure at the first surface.

6. The memory module of claim 5, where the second plurality of memory die comprises a second aligned strip of four face-up memory die separated from one another by a gap and attached below the passive interposer support structure at the second surface.

7. The memory module of claim 1, where the interposer support structure has no conductors formed on the first or second opposed surfaces.

8. The memory module of claim 1, where the plurality of conductors comprise solder ball conductors formed to fill one or more of the plurality of openings in the passive interposer support structure to electrically connect aligned contact pads on the first and second plurality of memory die.

9. The memory module of claim 1, where the patterned array of conductors on each memory die comprises a plurality of programming region structures comprising an array of program contact pads and connector lines which are used to program a signal of the first and second plurality memory die.

10. The memory module of claim 9, where the signal comprises n selection signals for selecting between $2^n$ memory die in the first and second plurality memory die.

11. The memory module of claim 1, where the memory module is connected to a printed circuit board.

12. An apparatus, comprising:
a non-conductive support structure having opposed first and second surfaces between which are formed a patterned array of openings;
a plurality of up to $2^n$ memory die attached to the first and second surfaces of the non-conductive support structure, each memory die including die conductive structures comprising:
a plurality of select contact pads arranged in n programming templates, and
redistribution conductor lines formed on an attachment face of each memory die;
a plurality of conductors formed in the patterned array of openings to connect the plurality of up to 2n memory die in series and to form n select lines in a continuous bus for selecting one of the plurality of up to 2n memory die by electrically connecting selected select contact pads and redistribution conductor lines from the plurality of up to 2n memory die;
wherein the attachment face of each of the plurality of up to $2^n$ memory die define a perimeter;
wherein each select line of the n select lines includes conductive structures of the die conductive structures and includes non die conductive structures;
wherein for each select line of the n select lines, except for the plurality of conductors formed in the patterned array of openings, all of the non die conductive structures of the select line between the memory die of the plurality of UP to $2^n$ memory die are located between the attachment faces of the plurality of UP to $2^n$ memory die and surfaces of the passive interposer within the perimeters of the attachment faces of the plurality of up to $2^n$ memory die.

13. The apparatus of claim 12, where the non-conductive support structure in which the patterned array of openings are formed comprises a layer of dielectric, ceramic, or plastic material or a mechanical support layer having a non-conductive exterior surface.

14. The apparatus of claim 12, where the patterned array of openings formed in the non-conductive support structure comprises:
parallel rows of openings positioned for alignment with contact pads formed on opposed peripheral sides of each of the plurality of up to $2^n$ memory die; and
an internal array of openings positioned for alignment with the plurality of select contact pads arranged in the n programming templates.

15. The apparatus of claim 12, where each of the plurality of up to $2^n$ memory die is formed with an identical dual in-line memory die.

16. The apparatus of claim 12, where the plurality of up to $2^n$ memory die comprises:
a first aligned strip of four face-down memory die separated from one another by a gap and attached on top of the non-conductive support structure at the first surface; and
a second aligned strip of four face-up memory die separated from one another by a gap and attached below the non-conductive support structure at the second surface.

17. The apparatus of claim 16, where each memory die has n=3 programming templates located at an interior position of said memory die, each programming template comprising:
four select contact pads formed on the attachment face of said memory die;
a first redistribution conductor line formed on the attachment face of said memory die and electrically connected to a first of the four select contact pads;
a second redistribution conductor line formed on the attachment face of said memory die and electrically connected to a second and third of the four select contact pads; and
a third redistribution conductor line formed on the attachment face of said memory die and electrically connected to a fourth of the four select contact pads.

18. The apparatus of claim 12, where each memory die comprises:

contact pads formed on opposite ends of a plurality of the redistribution conductor lines; and jumper contact pads formed on at least one end of the plurality of the redistribution conductor lines to provide a signal connection path across any gap between stacked overlapping die attached to an opposite face of the non-conductive support structure.

19. The apparatus of claim 12, where the non-conductive support structure and the plurality of up to $2^n$ memory die have substantially the same temperature coefficient of expansion.

20. The apparatus of claim 12, where the redistribution conductor lines formed on the attachment face of each memory die comprise a plurality of parallel lines extending in a linear or curved direction across the attachment face.

* * * * *